United States Patent

Glinski

[15] 3,701,198

[45] Oct. 31, 1972

[54] MONOLITHIC INTEGRATED CIRCUIT STRUCTURES AND METHODS OF MAKING SAME

[72] Inventor: Vincent J. Glinski, Hill, N.J.

[73] Assignee: Bell Telephone Laboratories, Incorporated, Murray Hill, N.J.

[22] Filed: Aug. 14, 1970

[21] Appl. No.: 63,885

Related U.S. Application Data

[62] Division of Ser. No. 786,228, Dec. 23, 1968, Pat. No. 3,614,555.

[52] U.S. Cl. ....................................29/578, 29/589

[51] Int. Cl. ............................................B01j 17/00

[58] Field of Search ........29/571, 578, 589; 148/175; 317/235 E

[56] References Cited

UNITED STATES PATENTS

| | | | |
|---|---|---|---|
| 3,427,513 | 1/1969 | Hilbiber | 317/235 |
| 3,442,723 | 5/1969 | Wakamiya | 148/186 |
| 3,520,741 | 7/1970 | Mankarious | 148/175 |
| 3,453,504 | 7/1969 | Compton et al. | 317/235 A |

*Primary Examiner*—Charles W. Lanham
*Assistant Examiner*—W. Tupman
*Attorney*—R. J. Guenther, Arthur J. Torsiglieri and George W. Houseweart

[57] ABSTRACT

An annular PN junction in conjunction with a relatively high resistivity substrate enables improved means for isolating functional elements in a monolithic semiconductor integrated circuit. In a semiconductor wafer, localized emitter zones and collector zones extend to a common depth from the surface of the wafer. The collector zone is annular in shape and encloses laterally the emitter zone. The resistivities and spacings of the regions in the wafer are such that with the annular PN junction reverse-biased, the depletion region therefrom extends completely underneath the material enclosed by the annular zone and thereby provides electrical isolation for a functional element in the enclosed material.

14 Claims, 12 Drawing Figures

INVENTOR
V. J. GLINSKI
BY
A. J. Torsiglieri
ATTORNEY

MONOLITHIC INTEGRATED CIRCUIT STRUCTURES AND METHODS OF MAKING SAME

This is a division of U. S. application Ser. No. 786,228, filed Dec. 23, 1968, in the name of V. J. Glinski, now U.S. Pat. No. 3,614,555.

BACKGROUND OF THE INVENTION

This invention relates generally to semiconductor devices and, more particularly, to the fabrication of semiconductor integrated circuits.

In the art of integrated circuitry, the functions of a plurality of individual electronic elements are provided within a unitary body of semiconductive material. A problem fundamental to this art has arisen from the use of relatively complex functional structures which, in turn, have required relatively complex, and hence costly, methods of fabrication.

Conventional junction-isolated semiconductor integrated circuits of the prior art are exemplified by the disclosures in U.S. Pat. No. 3,260,902 to E. H. Porter and in U.S. Pat. No. 3,341,755 to J. D. Husher et al. Fabrication of such devices typically requires at least one epitaxial growth operation, as many as seven separate photolithographic masking operations, and as many as five separate selective diffusions up to and including the step which defines the first layer of electrode metallization. These steps are associated with the selective formation of the following: $N^+$-type buried collector zones; $P^+$-type isolation zones; $N^+$-type deep collector contact zones; P-type base zones; $N^+$-type emitter zones; contact windows through the protecting oxide layer; and first layer of electrode metallization.

In the copending application Ser. No. 703,165, filed Feb. 5, 1968, and assigned to the assignee hereof, there is disclosed a fabrication technique which employs a nonselective base diffusion, and hence requires one less masking step and one less selective diffusion than does the prior art.

In the copending application Ser. No. 703,164, filed Feb. 5, 1968, now U.S. Pat. 3,575,741, issued April 20, 1971, and assigned to the assignee hereof, there is disclosed a fabrication technique which includes growing a relatively thin epitaxial layer of the same type semiconductivity as the substrate and which uses deep collector contact zones both as contact zones and as isolation zones. This technique employs still one less masking step and one less selective diffusion than does the aforementioned copending application.

Inasmuch as each separate processing step adds some amount to the total cost of the device, it is generally desirable to eliminate as many steps as possible.

SUMMARY OF THE INVENTION

Accordingly, an object of this invention is the reduction in the number of steps required to fabricate a semiconductor integrated circuit.

To this and other ends, I have invented a PN junction isolated semiconductor integrated circuit structure, the fabrication of which requires significantly fewer steps than does the fabrication of structures of the prior art.

As a particular embodiment of this invention, I disclose a bipolar transistor for an integrated circuit which requires only three masking operations and one selective diffusion up to and including the step which defines the first layer of electrode metallization. The transistor is formed in a semiconductive wafer which includes a relatively high resistivity substrate region of a first type semiconductivity and a relatively lower resistivity surface region, the bulk of which surface region is also of first type semiconductivity. A central emitter zone and a surrounding annular-like collector zone, both of a second type semiconductivity, extend to a common depth into the surface region. The collector zone and the emitter zone form a collector-base PN junction and an emitter-base PN junction, respectively, with the bulk of the surface region. Those portions of the surface region between the emitter zone and the collector zone and those portions of the surface region between the emitter zone and the substrate, taken together, comprise the base zone of the transistor. The relative spacings and resistivities of the zones and the regions are adjusted such that under normal operating conditions, the depletion region from the annular collector-base junction extends into the substrate and underneath the emitter zone, thereby forming an isolating collector structure which comprises the collector zone and the depletion region extending therefrom.

In one method of forming this structure, doping impurities are diffused nonselectively into a relatively high resistivity substrate of first conductivity type to form the relatively lower resistivity surface region of the same conductivity type. Other doping impurities are then selectively diffused simultaneously into the surface region to form the emitter and collector zones of the second conductivity type. This step requires one masking operation. Two other masking operations are used to define contact windows through a passivating surface dielectric layer and to define the first layer of electrode metallization.

In a second embodiment of this invention, localized buried zones of the second conductivity type are added to the above-described structure to minimize the amount of collector-base depletion region which must be produced to extend completely underneath the emitter zone and to enhance the current carrying ability of the device. This structure requires an additional masking operation and an additional diffusion to form the localized buried zones, and also requires an epitaxial layer.

A variety of other functional elements, e.g., diodes, resistors, and capacitors, also may be isolated in the aforementioned manner. The functional element or elements to be isolated are surrounded by an annular-like zone arranged such that the depletion region from the annular-like zone can be made to extend completely under the functional element or elements. In this manner these elements are completely contained within an integral isolating structure which comprises the annular-like zone and the depletion region therefrom.

BRIEF DESCRIPTION OF THE DRAWING

The invention will be more clearly understood from the following detailed description taken in conjunction with the drawing, in which.

DETAILED DESCRIPTION

Figure 1:
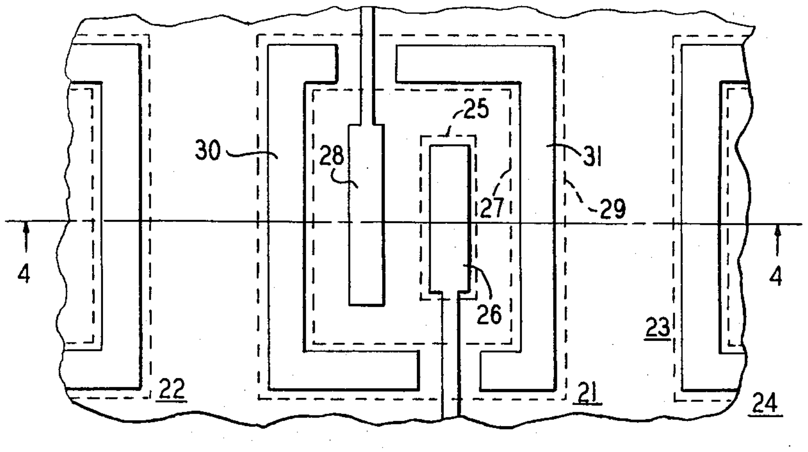
FIG. 1 shows a plan view of a bipolar transistor and portions of adjacent similar transistors fabricated in accordance with a first embodiment of this invention.

As a first embodiment of this invention, FIG. 1 illustrates schematically a plan view of a typical transistor 21 and portions of two adjacent similar transistors 22 and 23 within a portion 24 of a monocrystalline semiconductor wafer fabricated according to the first method set forth hereinbelow. Solid line patterns shown therein depict metallized electrodes which establish electrical contact to the transistor. Broken lines depict the positions of PN junctions beneath the surface of a passivating dielectric layer, e.g., an oxide, which overlies the semiconductor regions except where the electrodes are in electrical contact with those semiconductor regions. Accordingly, the broken line patterns indicate the boundaries of the various semiconductive zones which make up the transistors.

More particularly, transistor 21 comprises a rectangular emitter zone defined within broken line rectangle 25 and contacted electrically by metallic electrode 26; a rectangular base zone defined within broken line rectangle 27 and contacted electrically by metallic electrode 28; and an annular-like collector zone defined between broken line rectangles 27 and 29 and contacted electrically by metallic electrodes 30 and 31. For simplicity, only a portion of adjacent transistors 22 and 23 are shown.

It is to be understood that throughout this specification, and in the claims, the terms "annular" and "annular-like" are not to be limited to purely circular structures but include structures formed by straight line segments.

Figure 2:
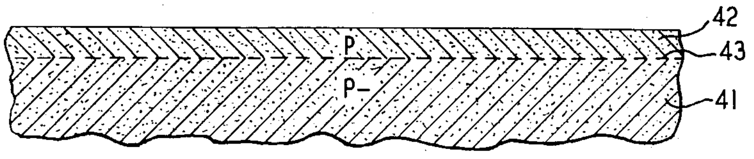
FIGS. 2–4 show cross-sectional views of the transistor in FIG. 1 substantially as it appears following successive fabrication steps in accordance with the first embodiment of this invention.
Figure 3:
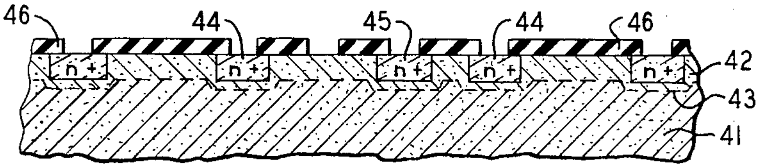
Figure 4:
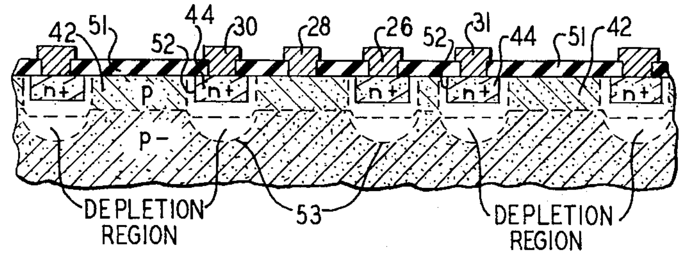

FIGS. 2–4 show cross-sectional views of the wafer in FIG. 1 substantially as it appears following successive fabrication steps in accordance with a first-described method.

As shown in FIG. 2, fabrication begins with a monocrystalline semiconductor substrate, 41. For example, substrate 41 may be a portion of a slice of P-type conductivity silicon produced by boron doping to have a substantially uniform resistivity of greater than about 10 ohm-centimeters. Substrate 41 typically may have a thickness of from a few microns to several hundred microns and may be prepared for subsequent processing by mechanical lapping and polishing or by chemical milling, both of which are well known in the art.

The next step forms a relatively lower resistivity P-type layer 42 overlying substrate 41. P-type layer 42 can be formed by a nonselective diffusion of acceptor impurities into the entire surface of substrate 41 or by well-known epitaxial growth techniques or by ion implantation or by any other suitable process known to alter the conductivity type of a semiconductive material. The resistivity and thickness of layer 42 will vary from one application to another, but a typical thickness of about 1 micron; and, if formed by diffusion or ion implantation, a surface concentration of about $10^{18}$ boron atoms per cubic centimeter are appropriate. Broken line 43 is included to illustrate a boundary between layers 41 and 42. Of course, it must be understood that there really is no boundary between these two layers in the ordinary use of the term "boundary." Broken line 43 simply represents that position at which the concentration of ionized acceptor impurities in layer 42 has decreased to that amount which is the relatively uniform concentration of ionized acceptor impurities in substrate 41.

The next step involves a masking operation to enable selective formation of N-type annular collector zone 44 surrounding emitter zone 45, shown in FIG. 3. These zones can be formed by a selective diffusion of phosphorous impurities through a silicon oxide mask 46, as shown, typically to a depth of about 1.0 micron and with a surface concentration of about $10^{20}$ atoms per cubic centimeter. Alternatively, zones 44 and 45 can be formed by selective ion implantation, in which case mask 46 would be selected to be an adequate barrier against the impinging ions. For example, 3,000 to 10,000 Angstroms of a metal such as gold or platinum may be used for the mask. As will be appreciated more fully hereinbelow, zones 44 and 45 advantageously are formed to a depth as great as or greater than the "boundary," 43, between P-type layers 41 and 42.

In a typical embodiment in which the substrate 41 was about 100 ohm-centimeters resistivity and the surface layer 42 was doped to a surface concentration of about $10^{18}$ per cubic centimeter, the width of the annular-like zone 44 was about 2 microns, and the shorter side of the rectangular junction represented by broken line 27 in FIG. 1 was about 10 microns in length. Rectangular emitter zone 45 was about 2 microns by 6 microns and was spaced from the junction represented by broken line 27 by at least about 1 micron at all points.

The structure is completed, as shown in FIG. 4, by coating with a passivating, insulating layer 51 and forming low resistance electrical connections 26, 28, 30, and 31 to the functional regions. Silicon oxide, silicon nitride, aluminum oxide, or zirconium oxide or multiple layers including combinations of these insulators typically may be used for layer 51. Of course, it will be understood that other suitable passivating insulators may be substituted instead.

It will be apparent that a variety of arrangements may be adopted for accomplishing actual electrical contact to the semiconductor regions and for accomplishing the interconnection of integrated arrays of functional elements. A particularly advantageous technique includes the use of a beam lead technology such as disclosed in U.S. Pat. No. 3,335,338 to M. P. Lepselter.

As is well known to those in the art, a space charge depletion region is associated with every PN junction even when no voltage is applied across the junction. FIG. 4 illustrates annular-like junction 52 formed between N-type annular-like collector zone 44 and P-type regions 41 and 42. Broken lines 53 depict the approximate positions of the boundaries of the depletion region associated with annular-like junction 52 with no bias voltages applied. Of course, it must be realized that the boundaries of depletion regions are neither smooth nor distinct and that the broken lines are merely representative of the boundaries for illustrative purposes. The depletion region around emitter zone 45 also is shown in FIG. 4. However, in operation, the emitter-base junction will be forward-biased, and the depletion region around the emitter will shrink to a size such that it is insignificant in the further explanation of this invention.

Figure 5:
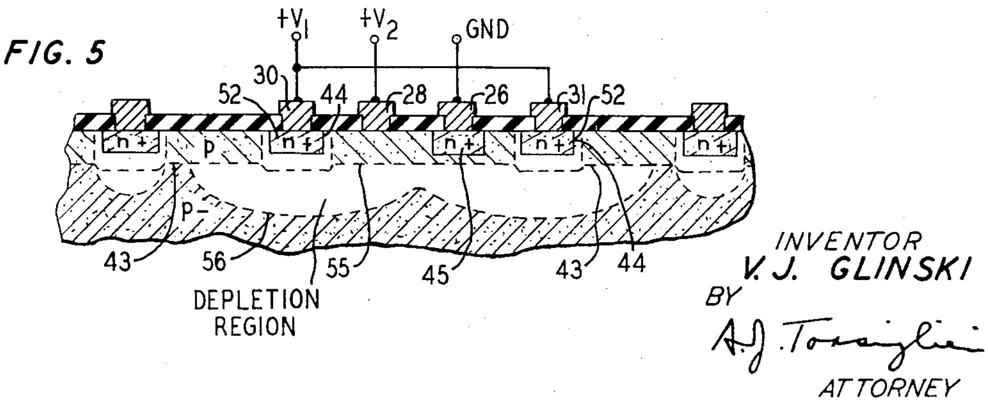
FIG. 5 shows a cross-sectional view of the transistor of FIG. 1 with operating voltages applied.

In accordance with the principles of this invention, FIG. 5 illustrates schematically a novel use of a depletion region from a collector-base junction of a transistor to provide simultaneously both a "collecting" function and an "isolating" function for a transistor.

More specifically, in FIG. 5 there is represented schematically a first voltage $V_1$ applied to collector electrodes 30 and 31. A second voltage $V_2$ is applied to base electrode 28, and emitter electrode 26 is shown connected to ground, i.e., zero volt. Substrate 41 will be presumed to be "floating," i.e., not directly connected to any voltage. When the transistor is operating in the normal active region, $V_2$ is typically 0.7–0.8 volt, and $V_1$ is somewhat greater, e.g., 1–5 volts. In this case, the emitter-base junction formed between N-type zone 45 and P-type layer 42 is forward-biased and the depletion region associated therewith is relatively narrow. As noted above, this emitter-base depletion region is of little or no consequence in explaining this invention, and is not shown in FIG. 5.

However, the depletion region associated with annular-like collector-base junction 52 is critical to this invention. Inasmuch as the resistivity of substrate 41, e.g., 100 ohm-centimeters, is so much higher than the resistivity of layer 42, e.g., 0.1 ohm-centimeter, the depletion region from annular-like zone 44 does not expand laterally very far into layer 42 but does expand greatly into substrate 41. Thus, it will be appreciated that the disposition of layer 42 is important in determining the shape and extent of the depletion region extending from zone 44. In particular, as shown in FIG. 5, with a few volts reverse-bias applied across annular-like junction 52, those portions of the depletion region extending from opposite sectors of that annular-like junction join together. In this condition, the depletion region extends completely underneath all the semiconductive material enclosed within annular-like zone 44. In FIG. 5, the boundaries of the collector-base depletion region are indicated by broken lines 55 and 56.

It will be appreciated that once the collector-base depletion region joins together underneath all the enclosed material, that enclosed material is electrically isolated from the P-type material which surrounds the annular-like zone in a manner similar to the back-to-back diode isolation. However, the structure has been fabricated by processing which is significantly simplified with respect to the prior art.

The extent of space charge depletion with a given amount of reverse-bias on the collector-base junction depends primarily on the doping level of the semiconductive material adjacent that junction. A lower doping level, of course, implies a greater width of depletion for a given voltage. For this reason, the annular-like collector zone advantageously is formed to a depth as great as or greater than the "boundary," 43, between P-type layers 41 and 42, as shown in FIG. 3, because layer 42 is typically much more highly doped than substrate layer 41.

The following numerical examples are approximate and are included only to give the worker in the art a feeling for typical dimensions of the above-described structure. It is well known that the width of a depletion region depends upon the doping levels adjacent the junction and varies with voltage applied to the junction. In typical integrated circuit applications, the maximum reverse-bias voltage applied to the isolating collector junction is limited to some voltage less than avalanche breakdown. In an $N^+$-P junction in which the P-type material is of substantially uniform 100 ohm-centimeters resistivity, the avalanche breakdown voltage is greater than 100 volts. However, due to the more heavily doped surface P-type regions into which the annular-like junctions are formed according to the disclosed embodiment of this invention, the effective avalanche breakdown voltage associated with the annular-like junctions is about 6–8 volts. With 1.0 volt reverse-bias, the width of space charge depletion in the P-type material is about 4 microns ($4\times10^{-4}$ cm). With 5.0 volts reverse-bias, about 8 microns ($8\times10^{-4}$ cm) depletion is obtained. Thus it will be appreciated that the maximum inside radius of an annular isolating junction as described hereinabove will be limited to a practical value of about 10 microns, ($10^{-3}$ cm or about 0.5 mil) if a substrate of about 100 ohm-centimeters is used in conjunction with a more highly doped nonselective surface portion. Of course, the more highly doped surface portions may be omitted if a larger isolation zone is deemed more important than the high frequency performance of the devices isolated therewithin. Also, higher resistivity substrates, e.g., 2,500 ohm-centimeters, may be used.

Inasmuch as it is often desired to have complete space charge depletion underneath the emitter with a minimum of reverse voltage applied to the collector-base junction, and inasmuch as an isolated region larger than allowed by the above-described radius limitation may be desired for certain applications, a second embodiment of this invention, illustrated in FIGS. 6–12, may often find advantageous application.

Figure 6:
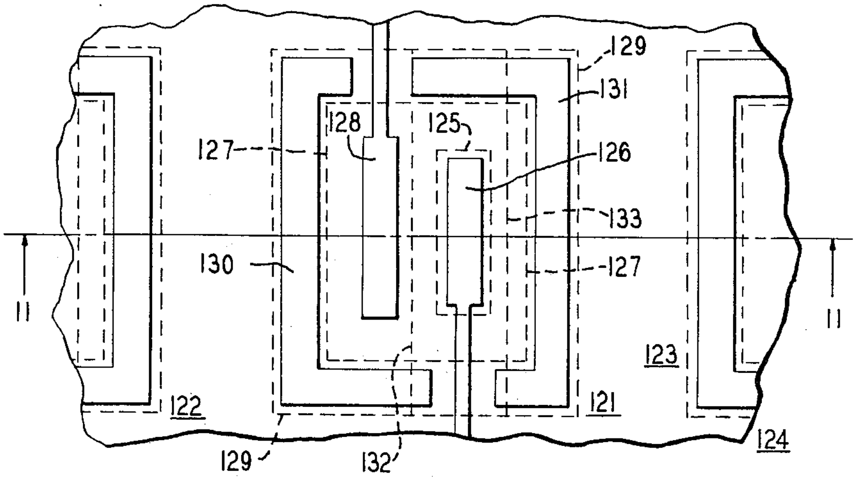
FIG. 6 shows a plan view of a bipolar transistor and portions of adjacent similar transistors fabricated in accordance with a second embodiment of this invention.

In FIG. 6 there is illustrated schematically a plan view of a typical transistor 121 and portions of two adjacent similar transistors 122 and 123 within a portion, 124, of a semiconductive wafer fabricated according to a second method, set forth hereinbelow. As will become more evident hereinbelow, transistor 121 in FIG. 6 is similar to transistor 21 in FIG. 1 with respect to surface geometry, but somewhat different with respect to the functional semiconductive zones. As in FIG. 1, solid line patterns in FIG. 6 depict metallic electrodes and broken line patterns depict the position of PN junctions and, accordingly, of the various semiconductive zones which make up the transistors.

More particularly, transistor 121 comprises a rectangular emitter zone defined within broken line rectangle 125 and contacted electrically by metallic electrode 126; a rectangular base zone defined within broken line 127 and contacted electrically by metallic electrode 128; and an annular-like collector zone defined between broken lines 127 and 129, 132 and 129, and 133 and 129 and contacted electrically by metallic electrodes 130 and 131. For simplicity only a portion of adjacent transistors 122 and 123 are shown.

FIGS. 7–11 show cross-section views of the wafer in FIG. 6 substantially as it appears following successive fabrication steps in accordance with the second-described method.

Figure 7:
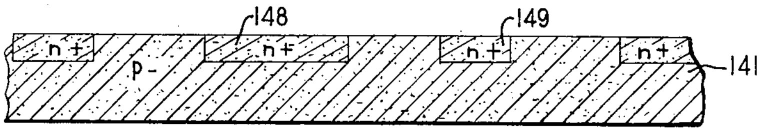
FIG. 7–11 show cross-sectional views of the transistor of FIG. 6 substantially as it appears following successive fabrication steps in accordance with the second embodiment of this invention.
Figure 8:
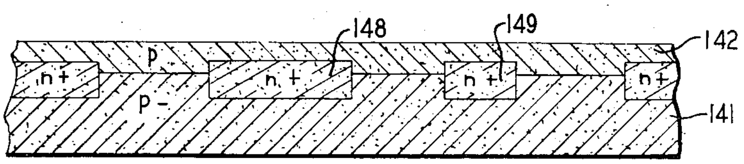

As shown in FIG. 7, in accordance with the second-described method, fabrication begins with a relatively high resistivity monocrystalline semiconductor substrate, 141. For example, substrate 141 may be a portion of a slice of P-type conductivity silicon produced by boron doping to have a substantially uniform resistivity of greater than about 10 ohm-centimeters. The substrate typically may have a thickness of from a few microns to a few hundred microns and may be prepared for subsequent processing by mechanical lapping and polishing or by chemical milling, both of which are well known in the art.

Rectangular N-type zones 148 and 149 are formed into substrate 141 using any of a variety of well-known techniques such as described with reference to the first embodiment hereinabove. Zones 148 and 149 typically may be formed by solid state diffusion using well-known photolithographic and oxide masking techniques. A relatively slow diffusing donor impurity, e.g., antimony or arsenic, typically will be diffused to a surface concentration of about $10^{20}$ impurity atoms per cubic centimeter or greater and to a depth of about 1 to 2 microns into substrate 141.

Subsequent to forming zones 148 and 149, a relatively low resistivity P-type layer, 142, is formed over the surface of substrate 141 and over zones 148 and 149 by processes well known in the art, e.g., epitaxial growth techniques. To achieve high frequency devices, layer 142 typically will be less than about 2 microns thick, and in this specific example, is about 1 micron thick and is doped with boron to provide a substantially uniform resistivity of about 0.1 ohm-centimeter.

If layer 142 is formed by an epitaxial growth technique, a substantial heat treatment will be involved. During this heat treatment, some outdiffusion of zones 148 and 149 into layer 142 will occur. The extent of this outdiffusion can be controlled by varying the amount of heat treatment used and by selecting slower or faster diffusing impurities to form buried zones 148 and 149. In a specific example, antimony was used to form the buried zones and an outdiffusion of about 0.25 micron into a 1 micron epitaxial layer was observed.

Figure 9:
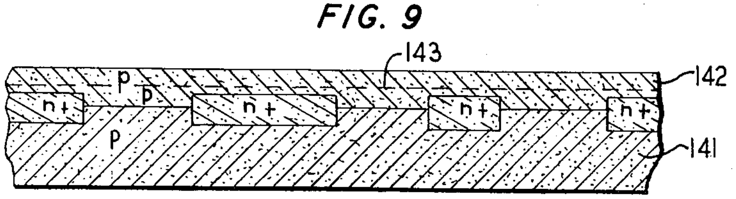

In the next step, as shown in FIG. 9, P-type impurities are nonselectively diffused into the entire surface of layer 142 to form a more highly doped surface region in which the concentration of ionized acceptor impurities decreases inward from the surface. This layer is not essential to the practice of this invention, and the more important reasons for its inclusion or omission will be discussed more fully hereinbelow. For this specific embodiment, however, boron was nonselectively diffused to a surface concentration of about $10^{18}$ atoms per cubic centimeter and to a depth of about 0.6 micron ($6\times10^{-5}$ cm) into layer 142. Broken line 143 indicates the position at which the concentration of ionized acceptor impurities in the surface layer has decreased to the level of the background concentration of ionized acceptor impurities in layer 142.

Figure 10:
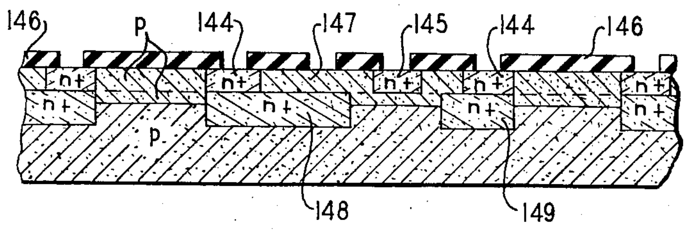

Next, as shown in FIG. 10, a final selective diffusion of donor impurities through a mask, 146, forms the relatively low resistivity N-type zones 144 and 145. Zone 144 is an annular-like zone which surrounds zone 145 and confines the lateral extent of the base zone, 147, and which provides a portion of the collector region and a portion of the isolation for transistor 121. Within the context of this embodiment, the base zone, 147, is considered to be the P-type material enclosed by the annular-like zone 144. Advantageously, annular-like zone 144 is formed to intersect buried zones 148 and 149 to achieve minimum collector series resistance. It will be apparent that since annular-like zone 144 intersects the rectangular buried zones 148 and 149, and since all three zones are of the same type semiconductivity, the structure consisting of these three zones may be considered to be one annular-like zone.

Emitter zone 145 is disposed directly above the space between buried zones 148 and 149. This disposition of the emitter zone enables the simultaneous formation of annular-like zone 144 and emitter zone 145 without having the emitter zone intersecting, and thus electrically contacting, a buried collector zone. In a specific embodiment, zones 144 and 145 simultaneously were formed by a solid state diffusion of phosphorous atoms to a surface concentration of about $10^{20}$ atoms per cubic centimeter or greater. In that embodiment, the space between zones 148 and 149 was about 5 microns and the width of emitter zone 145 was about 2 microns.

As mentioned hereinabove, the lower resistivity P-type diffused surface layer is not necessary to the practice of this invention. However, several factors should be considered in deciding whether or not to use it. First, the P-type diffusion produces a higher concentration of P-type impurities adjacent the sidewalls of the emitter than adjacent the bottom of the emitter. This tends to suppress minority carrier injection through the emitter sidewalls. Since minority carriers injected through the emitter sidewalls have little chance of being collected by the collector, this suppression should enhance the emitter injection efficiency and the forward transfer factor, and thus enhance the gain of the transistor. Secondly, the diffused impurity profile produces a built-in electric field in the base zone in such a direction to oppose minority carrier movement toward the surface. This effect tends significantly to decrease minority carrier recombination at the surface and also tends to reduce the effective volume available for minority carrier storage within the base zone. However, the inclusion of the layer adds an extra step, and thus extra cost, to the fabrication process.

Figure 11:
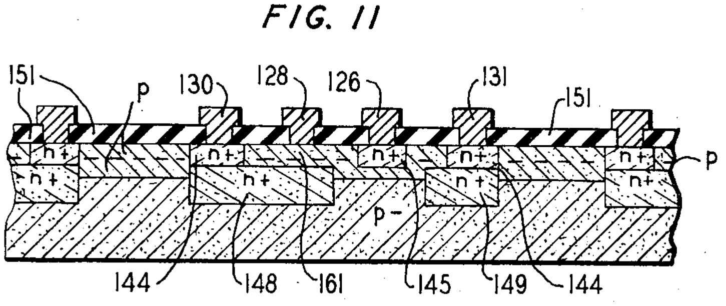

FIG. 11 shows a completed device having a passivating, insulating coating, 151, and metal electrodes 126, 128, 130, and 131 to emitter zone 145, base zone 161, and collector zone 144, respectively. As in the first embodiment, coating 151 may be selected from any of the insulating materials known to be useful as passivating coatings on a semiconductor device, e.g., silicon oxide, silicon nitride, zirconium oxide, aluminum oxide, etc. As in the first embodiment, it will be apparent that a variety of arrangements, e.g., beam lead techniques, may be adapted for forming the metal electrodes and for accomplishing the interconnection of integrated arrays of functional elements.

Figure 12:
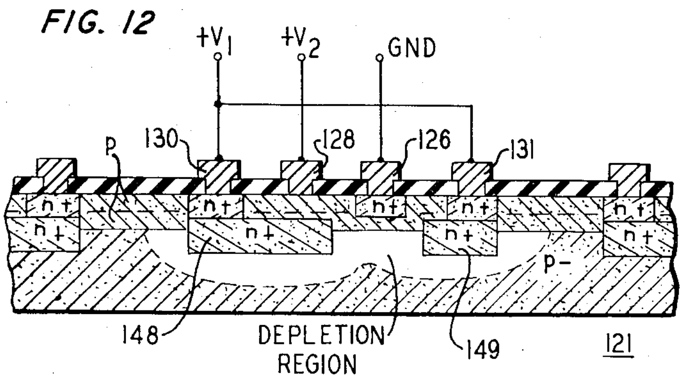
FIG. 12 shows a cross-sectional view of the transistor of FIG. 6 with operating voltages applied.

In FIG. 12 the completed transistor, 121, is schematically shown connected to operating voltages. Emitter electrode 126 is shown connected to ground, i.e., zero volt. Collector electrodes 130 and 131 are connected together and to a common positive voltage $V_1$. Base electrode 128 is connected to a second positive voltage $V_2$ which is less than $V_1$. In the normal active mode of operation, $V_2$ is typically 0.7–0.8 volt, and $V_1$ is somewhat greater, e.g., 1–5 volts. It will be apparent that with these voltages applied the collector-base junction is reverse-biased.

It should also be apparent that less reverse-bias on the collector base junction is required completely to deplete the region under the emitter of the transistor in FIG. 12 than was required by the device in FIG. 5. This is because zones 148 and 149, in FIG. 2 are physically closer to each other than are zones 44 in FIG. 5. Thus, transistor 121, in FIG. 6, may be advantageous for some applications in that transistor operation is achieved with less reverse-bias on its collector-base junction. However, transistors 21, in FIG. 1, inherently is less expensive to fabricate and is suitable for less demanding applications.

Although the invention has been described in terms of certain specific embodiments, it will be understood that other arrangements may be devised by those skilled in the art which likewise fall within the scope and spirit of the invention. For example, in some applications it may be desirable to omit one of the two buried zones from the embodiment depicted in FIGS. 6–12. More specifically, in FIG. 11 it is apparent that annular-like collector zone 144 is not equidistant from emitter zone 145 because of the need for intervening base electrode 128. Thus, for some applications buried zone 148, which extends under the base contact, may be retained and buried zone 149 may be omitted.

In addition, methods for forming diodes, resistors, capacitors, and field-effect transistors have not been discussed because methods for forming these and other functional elements will be apparent from the foregoing description.

Similarly, the use of N-type material for the substrate and epitaxial layer with corresponding substitution of P type for the second conductivity type to form PNP bipolar transistors and complementary structures also will be apparent.

I claim:

1. A method of fabricating a monolithic semiconductor integrated circuit comprising the steps of forming a relatively thin, relatively low resistivity layer of a first type semiconductivity contiguous with a surface of a monocrystalline, relatively high resistivity body of the first type semiconductivity, forming simultaneously a pattern of localized zones of a second type semiconductivity completely through the layer, each of said zones forming a PN junction with the layer, and forming electrode connections to the zones and to the layer, wherein the pattern of zones includes an annular-like zone which encloses a portion of the layer, the relative spacings and doping levels of the zones, of the layer, and of the body being such that with the junction between the annular-like zone and the layer reverse-biased by some amount less than avalanche, the depletion region from that junction extends completely underneath all of that part of the layer enclosed by the annular-like zone, whereby that portion of the layer enclosed by the annular-like zone is electrically isolated from the remaining portions of first type semiconductivity.

2. A method of fabricating a self-isolated bipolar transistor in a monolithic semiconductor integrated circuit comprising the steps of forming a first pattern of localized zones including a pair of spaced zones of first type semiconductivity adjacent a surface of a bulk portion of second type semiconductivity of relatively high resistivity, forming a relatively thin, relatively low resistivity layer of second type semiconductivity overlying the surface of the bulk portion and the first pattern of zones, forming simultaneously by a selective introduction of impurities into the surface of the layer a second pattern of localized zones including an annular-like zone and an emitter zone within and spaced from the annular-like zone, the zones of the second pattern being of the first type semiconductivity, and all of said zones of the second pattern forming a PN junction with the layer, and all of said zones of the second pattern extending completely through the layer to a common depth from the surface of the layer, and forming electrode connections to the second pattern of zones and to the layer, wherein the selective zone forming step is controlled such that the emitter zone is smaller than the space between the pair of zones of the first pattern and is registered with and formed between said pair of zones, and the annular-like zone is formed such that it intersects both of the pair of zones, whereby the space between the pair of zones can be depleted of free charge carriers, thus to provide electrical isolation for the semiconductive material contained therewithin.

3. A process for forming an integrated circuit having a plurality of functional elements isolated one from another and which requires only three masking operations and one selective impurity-introducing step up to and including the step which defines the first layer of electrode metallization which comprises the steps of:

forming a relatively thin, relatively low resistivity layer of a first type semiconductivity contiguous with a surface of a monocrystalline, relatively high resistivity bulk portion of the first type semiconductivity;

forming simultaneously by the one selective introduction of impurities a pattern of localized zones including annular-like zones of a second type semiconductivity all extending completely through the layer to a common depth, and such that each of said zones forms a PN junction with the layer;

forming electrode connections to the zones and to the layer; and controlling the above-recited steps so that the relative spacings and doping levels of the zones, of the layer, and of the bulk portion are such that with the junction between an annular-like zone and the layer reverse-biased by some amount less than avalanche, the depletion region from that junction extends completely underneath that part of the layer enclosed by the annular-like zone, whereby that portion of the layer enclosed by the annular-like zone is electrically isolated from the remaining portions of first type semiconductivity.

4. A method as recited in claim 3 wherein the layer is formed by nonselective introduction of impurities of the first type semiconductivity into the entire surface of the monocrystalline body.

5. A method as recited in claim 4 wherein the nonselective introduction of impurities is accomplished by ion implantation.

6. A method as recited in claim 4 wherein the nonselective introduction of impurities is accomplished by solid state diffusion.

7. A method as recited in claim 3 wherein the layer is formed by epitaxial deposition upon the surface of the monocrystalline body.

8. A method as recited in claim 3 wherein the resistivity of the body is in the range of 10 to 2,500 ohm-centimeters.

9. A method as recited in claim 3 wherein the resistivity of the layer is about 0.1 ohm-centimeters.

10. A method as recited in claim 9 wherein the resistivity of the body is at least 100 ohm-centimeters and the minimum inner diameter of the annular-like zone is less than about 10 microns.

11. A method as recited in claim 3 wherein one of the zones of the second type conductivity is formed simultaneously with and laterally within and so as to be enclosed by but not intersected by the annular-like zone, said zone for providing an emitter for a transistor.

12. A method as recited in claim 11 wherein:

one of the electrodes contacts the annular-like zone for providing ohmic connection to the collector of a transistor;

a second one of the electrodes contacts the emitter zone of second type semiconductivity zone for providing low resistivity electrical connection to the emitter of the transistor; and a third electrode is formed laterally between and spaced from the emitter and collector electrodes for providing low resistance connection to the base of the transistor.

13. A method as recited in claim 12 comprising the additional step of forming a buried localized zone of second type semiconductivity underlying the layer and disposed so as to intersect a portion of the annular-like zone and so as to extend from the annular-like zone underneath the base electrode to an extent insufficient to intersect the emitter zone so as thereby to reduce the voltage required to produce sufficient depletion that isolation is achieved.

14. A method for forming an integrated circuit having a plurality of bipolar transistors isolated one from another and which method requires only three masking operations and one selective impurity-introducing step up to and including the step which defines the first layer of electrode metallization comprising the steps of:

forming a semiconductor body including a relatively thin, relatively low resistivity layer of a first type semiconductivity contiguous with a surface of a monocrystalline, relatively high resistivity bulk portion of the first type semiconductivity;

forming over the surface of the layer a first mask having a plurality of annular-like apertures;

selectively introducing impurities through the apertures in the mask to form a pattern of annular-like localized zones extending completely through the layer to a common depth, and such that the zones form PN junctions with the layer;

forming over the surface of the layer and zones a second mask having apertures where it is desired to contact selectively portions of the layer and zones;

depositing conductive material over and through the apertures in the second mask;

forming a third mask over the conductive layer such that the pattern in the second mask defines the desired electrode configuration;

removing the portions of the conductive material not protected by the third mask; and controlling the above-recited steps so that the relative spacings and doping levels of the zones, of the layer, and of the bulk portion are such that with the junction between the annular-like zone and the layer reverse-biased by some amount less than avalanche, the depletion region from that junction extends completely underneath that part of the layer enclosed by the annular-like zone.

* * * * *